United States Patent
Kuzmenka

(10) Patent No.: US 7,053,682 B2
(45) Date of Patent: May 30, 2006

(54) DEVICE AND METHOD FOR CLOCK GENERATION

(75) Inventor: Maksim Kuzmenka, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/281,031

(22) Filed: Oct. 25, 2002

(65) Prior Publication Data

US 2003/0080794 A1 May 1, 2003

(30) Foreign Application Priority Data

Oct. 31, 2001 (DE) .......................... 101 53 751

(51) Int. Cl.
*H03B 19/00* (2006.01)

(52) U.S. Cl. .................. 327/122; 327/117; 327/291
(58) Field of Classification Search ............ 327/72–75, 327/82, 113, 115, 117, 122, 291, 116
See application file for complete search history.

(56) References Cited

U.S. PATENT DOCUMENTS

| | | | | |
|---|---|---|---|---|
| 4,390,865 A | * | 6/1983 | Lauro | 341/116 |
| 4,737,721 A | | 4/1988 | Lippl | 327/122 |
| 5,408,418 A | * | 4/1995 | Lippmann et al. | 364/509 |
| 5,614,861 A | * | 3/1997 | Harada | 329/308 |
| 5,903,605 A | * | 5/1999 | Crittenden | 327/7 |
| 6,011,386 A | * | 1/2000 | Li et al. | 323/313 |
| 6,016,283 A | * | 1/2000 | Jeong | 365/233 |
| 6,150,855 A | * | 11/2000 | Marbot | 327/116 |
| 6,184,736 B1 | * | 2/2001 | Wissell et al. | 327/291 |
| 6,212,126 B1 | | 4/2001 | Sakamoto | |

* cited by examiner

*Primary Examiner*—Dinh T. Le
(74) *Attorney, Agent, or Firm*—Laurence A. Greenberg; Werner H. Stemer; Ralph E. Locher

(57) ABSTRACT

A clock generator includes an interface for receiving a plurality of n periodical signals of the same frequency which are phase-shifted with respect to each other, wherein n/3. Further, a clock signal generator is provided for generating respective clock edges of a clock signal if at least two of the phase-shifted signals fulfill a predetermined relationship with respect to each other, wherein the clock signal has a frequency which is n or 2n times the frequency of the phase-shifted signals.

26 Claims, 2 Drawing Sheets

DEVICE AND METHOD FOR CLOCK GENERATION

BACKGROUND OF THE INVENTION

1. Field of the Invention

The present invention relates to a device and a method for clock generation and in particular relates to such devices and methods suitable for providing a high-frequency clock for memory modules.

2. Description of Prior Art

A plurality of electronic devices, like for example memory modules, operate using a clock which is provided to them externally or which is generated in the circuit on the basis of input signals. Memory modules, like for example DRAM modules, require clock signals with continuously increasing clock frequencies. Such clock signals are presently realized by integrated ultra-high-frequency PLL circuits (PLL=Phase Locked Loop). Alternatively, differential clock signals are used. Such a generation of clock signals is expensive and labor intensive, however. Apart from that, problems regarding the shaping of the clock signals and regarding the distribution of clock signals, i.e. supplying the clock signals from the location of generation to the destination, exist in such known clock signal generation means.

SUMMARY OF THE INVENTION

It is the object of the present invention to provide a cheaper and less labor-intensive possibility to provide a very high-frequency clock signal for electronic circuits, in particular for memory modules.

According to a first aspect of the invention, this object is achieved by a clock generator, comprising:

an interface for receiving a plurality of n periodical signals having the same frequency and being phase-shifted with respect to each other, wherein n/3; and a clock signal generation means for generating respective clock edges of a clock signal if at least two of the phase-shifted signals satisfy one predetermined relationship with respect to each other, wherein the clock signal has a frequency which is n or 2n times the frequency of the phase-shifted signals.

Further, the present invention provides a method for generating a clock signal, comprising:

receiving a plurality of periodical signals having the same frequency and being phase-shifted to each other; and generating respective clock edges of a clock signal if at least two of the phase-shifted signals satisfy a predetermined relationship with respect to each other, wherein the clock signal has a frequency which is n or 2n times the frequency of the phase-shifted signals.

According to the present invention a clock signal comprising a higher frequency than the phase-shifted signals is generated on the basis of at least two periodical signals of a first frequency which are phase-shifted to each other. To this end, the present invention is based on the findings that phase-shifted signals of the same frequency and preferably the same amplitude within a signal period defined by their frequency comprise a plurality of intersections. If a clock edge of a clock signal is generated at each of these intersection points, then a clock signal may be generated whose frequency exceeds the frequency of the phase-shifted signals.

If, for example, two phase-shifted signals of the same frequency are considered, then a pulse train may be generated comprising the double-frequency of the phase-shifted input signals, if at each of their intersection points a rising or a falling edge of the clock signal is generated successively. Further, a pulse train may by generated using the two above-mentioned phase-shifted signals, which comprises the fourfold frequency of the phase-shifted signals if a rising clock edge is generated at each intersection point of the phase-shifted signals and a pulse of a predetermined pulse duration is generated for each rising edge. In the same way a falling clock edge may be generated at each intersection point, wherein then further a "pulse break" is generated for each falling clock edge, i.e. a phase of a low level of a predetermined duration.

The present invention is particularly suitable for being used with sinusoidal phase-shifted signals, wherein, however, any periodical signals may be used advantageously, whose amplitude continuously changes between a maximum and a minimum value. As a further example of such a signal, for example, a triangle signal or a trapezoidal signal is indicated.

According to the invention the signals preferably comprise a phase difference of 360°/n to each other, if n phase-shifted signals are used. Thus, when using three phase-shifted signals, the individual signals comprise a phase shift of 120° to each other, while when using two phase-shifted signals the individual signals comprise a phase shift of 180° to each other. The predetermined relationship of the phase-shifted signals to each other is preferably detected using comparators, wherein logic gates which are interconnected in order to supply the corresponding functionality are connected to the outputs of the comparators. Further, according to the invention, the phase-shifted signals are preferably generated by generating correspondingly phase-shifted versions of an individual input signal.

Thus, the present invention provides a completely new architecture for generating a clock for an electronic means using one or several input signals. The present invention facilitates the generation of a higher frequency clock in an electronic component compared to the periodical input signal or the periodical input signals so that it is sufficient to supply lower frequency input signals to the electronic modules. The present invention facilitates a simple implementation of clock signals whose frequency exceeds the frequency of an input signal by a multiple. When using the present invention in connection with memory modules, consequently a multiplication of the data rate regarding a periodical input signal may easily be implemented.

BRIEF DESCRIPTION OF THE DRAWINGS

In the following, a preferred embodiment of the present invention is explained in more detail referring to the accompanying drawings, in which.

DESCRIPTION OF PREFERRED EMBODIMENTS OF THE INVENTION

Figure 1:
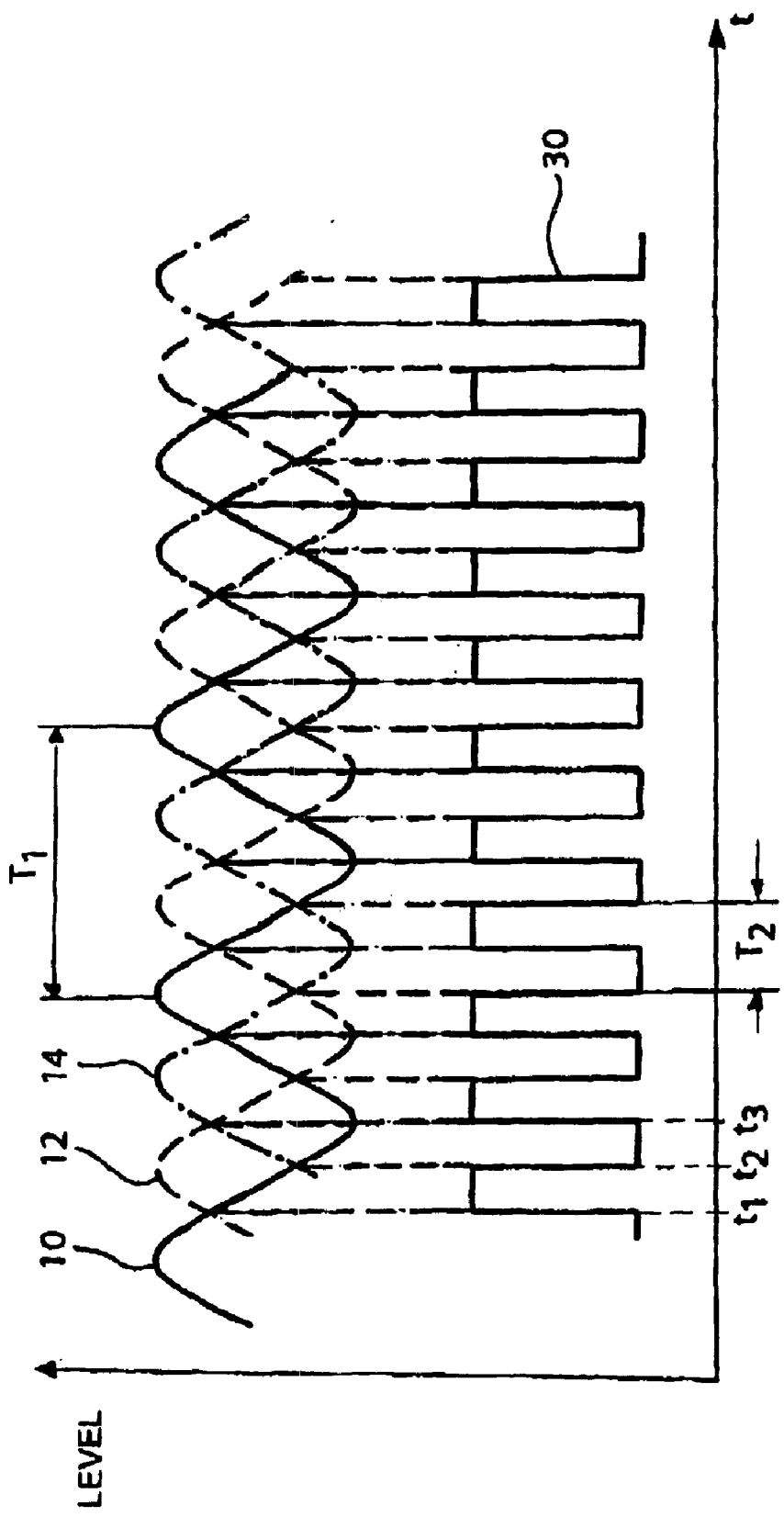
FIG. 1 shows signal courses of three phase-shifted signals and of one clock signal generated from the same.
Figure 2:
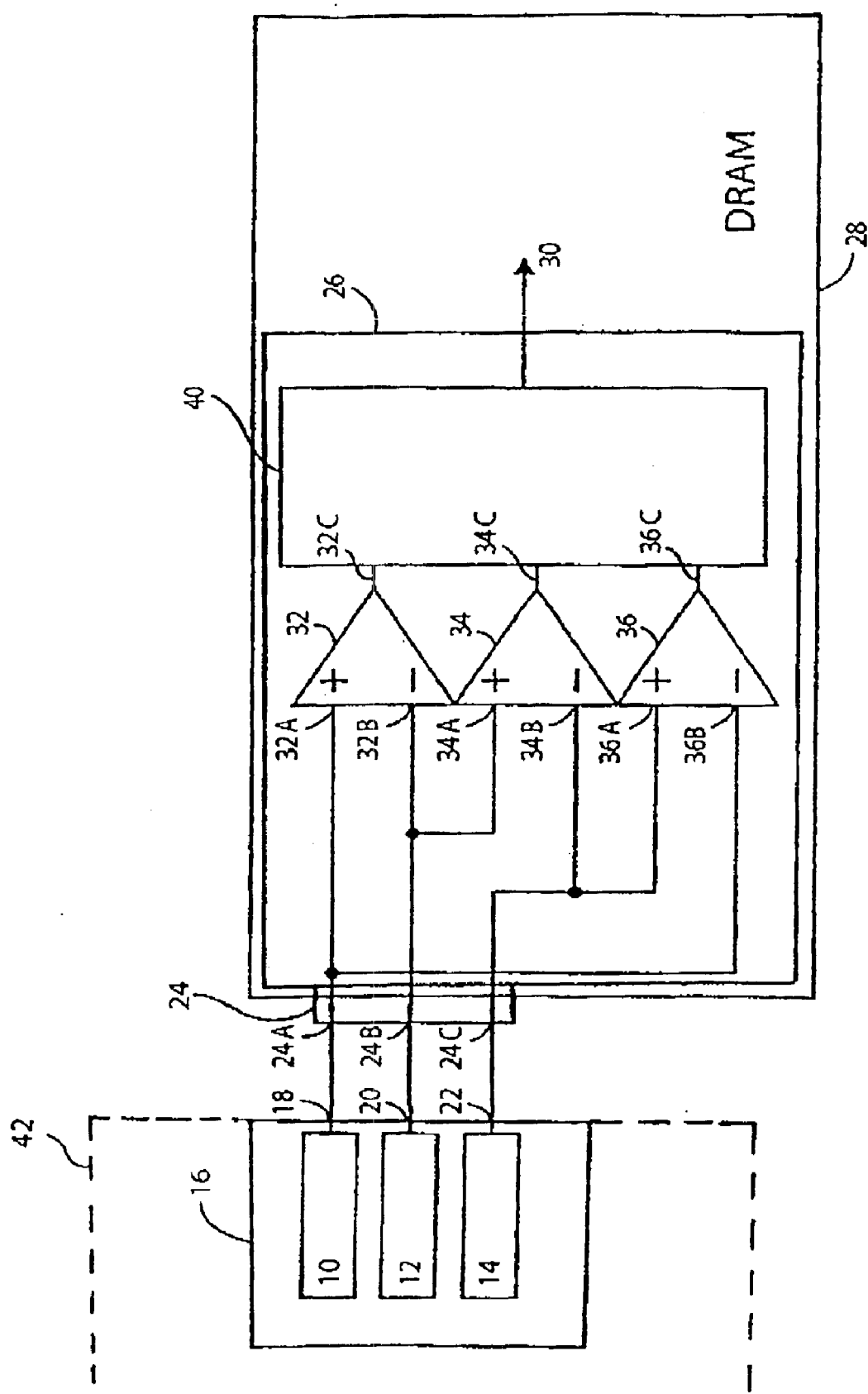
FIG. 2 shows a schematical illustration of a circuitry for generating the clock signal illustrated in FIG. 1.

Referring to FIGS. 1 and 2 an embodiment of the present invention is discussed in the following, wherein three phase-shifted signals for generating one clock signal are used. The time course of the three phase-shifted signals is illustrated in FIG. 1, wherein a first signal 10 is illustrated as a continuous line, a second signal 12 is illustrated as a dashed line and a third signal 14 is illustrated as a dash-dotted line. In the illustrated embodiment the phase shift between the signals 10, 12 and 14, respectively, is 120°, i.e., the second signal 12 lugs behind the first signal 10 by 120°, while the third signal 14 lugs behind the second signal 12 by 120°. The signals 10, 12 and 14, respectively, have a sinusoidal course of the same frequency and the same amplitude.

The signals 10, 12 and 14 may either be added to the inventive clock generator as input signals in this form or may be generated as part of the inventive clock generator from one individual input signal, for example the signal 10, by subjecting this input signal to different phase lags in order to generate the signals 12 and 14. A signal providing means 16 provided for this is schematically illustrated in FIG. 2. The signal providing means 16 has three outputs 18, 20 and 22, which are connected to an interface 24 of a clock signal generation means 26. The interface 24 comprises three inputs 24a, 24b and 24c. Thus, the signal 10 is supplied to the input 24a, the signal 12 is supplied to the input 24b and the signal 14 is supplied to the input 24c.

The signal-providing means 16 are shown as being part of a memory controller 42.

In the embodiment illustrated in FIG. 2 the clock signal generation means 26 is part of a memory module 28 and in particular of a DRAM memory module. The clock signal generation means thereby generates an internal clock 30 required for the memory module 28.

In FIG. 2 the signal providing means 16 and the clock signal generation means 26 are illustrated separately. For example, the signal providing means 16 may be part of a circuit structure external to the memory module, for example of the so-called chipset, which controls the communication between the memory module and an external processor. In this case, the interface 24 represents an input receiving the three input signals. It is, however, obvious that the signal providing means 16 may be part of the inventive clock generator, so that the interface 24 illustrates a device internal interface. In such a case the inventive clock generator only requires the input of a periodical input signal from the outside from which the inventive clock generator generates the phase-shifted signals necessary for generating the clock signal. For generating the phase-shifted signals any known means, for example phase locked loops and similar things, may be used.

As it is illustrated in FIG. 2, the inventive clock signal generation means 26 comprises a first comparator 32, a second comparator 34 and a third comparator 36 in the illustrated embodiment. A first input terminal 32a of the first comparator 32 is connected to the input 24a, while a second input 32b of the first comparator 32 is connected to the input 24b. A first input 34a of the second comparator 34 is connected to the input 24b, while a second input 34b of the second comparator 34 is connected to the input 24c. A first input terminal 36a of the third comparator 36 is connected to the input 24c, while a second input 36b of the third comparator 36 is connected to the input 24a.

Thus, the first comparator 32 compares the two signals 10 and 12 and generates an output voltage at an output 32c depending on this comparison. The second comparator 34 compares the second signal 12 to the third signal 14 and outputs a corresponding output signal at an output 34c of the same. Finally, the third comparator 36 compares the first signal 10 to the third signal 14 and outputs an output signal at its output 36c in response to this comparison. The output signals of the comparators in their usual form depend on the fact which of the two signals supplied to the respective comparator is larger.

The outputs 32c, 34c and 36c of the comparators 32, 34 and 36 are connected to a gate logic 40 which generates the clock signal 30 from the output signals of the comparators in the following way.

From the output signal of the comparator 32 the gate logic 40 recognizes that the amplitudes of the signals 10 and 12 are identical at a time $t_1$. Correspondingly, the gate logic 40 generates a rising edge of the clock signal 30. At a time $t_2$ the gate logic recognizes from the output signal of the comparator 36 that the signals 10 and 14 comprise the same level and correspondingly generates a clock edge of the clock signal 30. As the preceding clock edge was a rising clock edge at a time $t_1$, the gate logic 40 generates a falling clock edge at a time $t_2$. At the time $t_3$ the gate logic 40 recognizes from the output signal of the comparator 34 that the levels of the signals 12 and 14 are identical and generates a rising clock edge.

This method continues, so that the clock signal generation means 26 generates a clock signal 30 comprising a period duration $T_2$ of a third of the period duration $T_1$ from the three signals 10, 12 and 14 having a period duration of $T_1$. Thus, the clock signal 30 has three times the frequency of one of the signals 10, 12 or 14.

The corresponding setup of the gate logic 40 for obtaining the above-described functionality is obvious for people skilled in the art and consequently no further discussion is necessary herein.

Alternatively to the above-described embodiment it is possible to generate a clock signal from the three signals 10, 12 and 14 which comprises the sixfold frequency with regard to the phase-shifted signals. To this end, the gate logic 40 may be constructed to generate a rising clock edge when two of the phase-shifted signals comprise an identical level. Further, in such a case the logic comprises a means in order to generate a clock pulse of a predetermined length for each rising clock edge, i.e. to automatically provide a falling clock edge. To this end, it needs to be ensured that the pulse duration used for this is less than the time difference to the point of time at which the condition that two phase-shifted signals comprise an identical level is satisfied next. Preferably, the pulse duration is half of this time difference in order to generate a duty cycle of 50% between the high and the low level of the clock signal. As six intersection points of two phase-shifted signals each occur during a period duration of for example the signal 10, six clock pulses and therefore a clock signal with the sixfold frequency are generated during each period duration.

Alternatively, every time when the predetermined condition is satisfied, i.e. when two of the phase-shifted signals have an identical level in the described embodiment, a falling clock edge may be generated. In such a case, the gate logic would comprise a suitable circuitry in order to generate a rising clock edge for each falling clock edge after a predetermined period of time.

Although the present invention was described referring to an embodiment having three phase-shifted signals, any number of n phase-shifted signals may be used, wherein n is a natural number greater than 1. Preferably, thereby a phase shift of 360°/n is used between the individual signals, and then a clock signal 30 with a duty cycle of 50% is obtained, as it is illustrated in FIG. 1. The phase shift between the individual signals does however not have to be equal between the individual signals, but it may be different, wherein in such a case a still periodical clock signal with a duty cycle different from 50% is obtained.

Although the signals 10, 12 and 14 comprise identical amplitudes in the example described above referring to FIG. 1, this is no compelling condition. Rather, predetermined conditions between the different phase-shifted signals may be detected also with phase-shifted signals of different amplitudes in order to generate clock edges on the basis of such a detection. In this regard it is to be noted that the intersection points between phase-shifted signals for generating clock edges do not have to be used, although this represents by far the much preferred solution. Finally, it is noted that the signals 10 to 14 do not have to comprise the illustrated sinusoidal course. Rather, the present invention may also be realized using other signal courses, as long as the signals are of a periodical nature and comprise a continuous transition between a maximum and a minimum level, i.e. that no sharp transition occurs. For example, the signals may be implemented by triangled signals or trapezoidal signals.

REFERENCE NUMERAL LIST 10 first signal
12 second signal
14 third signal
16 signal providing means
18, 20, 22 outputs of the signal providing means
24 interface
24a, 24b, 24c interface inputs
26 clock signal generation means
28 memory module
30 internal clock
32 first comparator
32a, 32b inputs of the first comparator
32c output of the first comparator
34 second comparator
34a, 34b inputs of the second comparator
34c output of the second comparator
36 third comparator
36a, 36b inputs of the third comparator
36c output of the third comparator
40 gate logic

What is claimed is:

1. A clock generator for generating a clock signal having a constant frequency for a memory module, comprising:
   an interface provided on the memory module for receiving a plurality of periodical signals having the same frequency and being phase-shifted with respect to each other;
   a clock signal generator provided on the memory module for generating rising and falling clock edges of the clock signal having a constant frequency when at least two of the phase-shifted signals satisfy a predetermined condition with respect to each other, the constant frequency of the clock signal being higher than the frequency of the phase-shifted signals, and
   said memory module having a data rate being controlled based on the clock signal.

2. The clock generator according to claim 1, wherein the clock signal generator generates a rising or a falling clock edge every time when the predetermined condition is satisfied between two phase-shifted signals, depending on whether a rising or a falling edge precedes the satisfaction of the condition in the clock signal.

3. The clock generator according to claim 1, wherein the clock signal generator generates a rising clock edge every time the predetermined condition between two phase-shifted signals is satisfied and generates a falling clock edge for each rising clock edge after a predetermined period of time.

4. The clock generator according to claim 1, wherein the clock signal generator generates a falling clock edge every time the predetermined condition between two phase-shifted signals is satisfied and generates a rising edge to each falling edge after a predetermined period of time.

5. The clock generator according to claim 1, wherein the predetermined condition of the phase-shifted signals is a predetermined condition of a signal level of the phase-shifted signals.

6. The clock generator according to claim 5, wherein the clock signal generator generates a respective clock edge when the signal levels of the phase-shifted signals are identical.

7. The clock generator according to claim 1, further comprising a signal source for providing the phase-shifted signals.

8. The clock generator according to claim 7, wherein the signal source provides n phase-shifted signals of the same frequency comprising a phase difference of 360°/n to each other, wherein n is a natural number $\geq 3$, and wherein the frequency of the clock signal is n times the frequency of the phase-shifted signals.

9. The clock generator according to claim 1, wherein a signal source generates the phase-shifted versions of a single input signal.

10. The clock generator according to claim 7, wherein the signal source is part of a control circuit external to the memory module.

11. The clock generator according to claim 7, wherein the signal source provides n phase-shifted signals of the same frequency comprising a phase difference of 360°/n to each other, wherein n is a natural number $\geq 3$, and wherein the frequency of the clock signal is 2 n times the frequency of the phase-shifted signals.

12. A clock generator for generating a clock signal having a constant frequency for a memory module, comprising:
   an interface provided on the memory module for receiving a plurality of periodical signals having the same frequency and being phase-shifted with respect to each other;
   a clock signal generator provided on the memory module for generating respective clock edges of the clock signal having a constant frequency when at least two of the phase-shifted signals satisfy a predetermined condition with respect to each other, the constant frequency of the clock signal being higher than the frequency of the phase-shifted signals, said clock signal generator further having a plurality of comparators for comparing levels of the phase-shifted signals to each other; and
   said memory module having a data rate being controlled based on the clock signal, wherein the phase-shifted signal are sinusoidal signals.

13. The clock generator according to claim 1, wherein the clock signal generator comprises a logic gate circuit for generating the clock edges which is connected to the outputs of the comparators.

14. A method for generating a clock signal having a constant frequency for a memory module, comprising:
   receiving, at an interface provided on the memory module, a plurality of periodical signals having the same frequency and being phase-shifted with respect to each other;
   generating rising and falling clock edges of the clock signal having a constant frequency when at least two of the phase-shifted signals satisfy a predetermined condition with respect to each other, the constant frequency of the clock signal being higher than the frequency of the phase-shifted signals, and controlling a data rate of the memory module based on the clock signal.

15. The method according to claim 14, wherein every time the predetermined condition between two phase-shifted signals is satisfied a rising or a falling clock edge is generated depending on whether a rising or a falling clock edge precedes the satisfaction of the condition within the clock signal.

16. The method according to claim 14, wherein every time the predetermined condition between two phase-shifted signals is satisfied a rising clock edge is generated and which further comprises a step of generating a falling clock edge for each rising clock edge after a predetermined period of time.

17. The method according to claim 14, wherein every time the predetermined condition between two phase-shifted signals is satisfied a falling clock edge is generated, and which further comprises a step of generating a rising clock edge for each falling clock edge after a predetermined period of time.

18. The method according to claim 16, wherein the predetermined condition of the phase-shifted signals is a predetermined condition of signal levels of the same.

19. The method according to claim 20, wherein a respective clock edge is generated when the signal levels of the phase-shifted signals are identical.

20. The method according to claim 16, further comprising a step of providing n phase-shifted signals of the same frequency comprising a phase difference of 360°/n to each other, wherein n is a natural number 3, and wherein the frequency of the clock signal is 2n times the frequency of the phase-shifted signal.

21. A method for generating a clock signal having a constant frequency for a memory module, comprising:

receiving, at an interface provided on the memory module, a plurality of periodical signals having the same frequency and being phase-shifted with respect to each other;

generating respective clock edges of the clock signal having a constant frequency when at least two of the phase-shifted signals satisfy a predetermined condition with respect to each other, the constant frequency of the clock signal being higher than the frequency of the phase-shifted signals, and controlling a data rate of the memory module based on the clock signal, wherein the phase-shifted signals are sinusoidal signals.

22. The method according to claim 1, further comprising a step of providing n phase-shifted signals of the same frequency comprising a phase difference of 360°/n to each other, wherein n is a natural number ≧3, and wherein the frequency of the clock signal is 2n times the frequency of the phase-shifted signal.

23. A method for generating a clock signal having a constant frequency for a memory module, comprising:

receiving, at an interface provided on the memory module, a plurality of periodical signals having the same frequency and being phase-shifted with respect to each other;

generating respective clock edges of the clock signal having a constant frequency when at least two of the phase-shifted signals satisfy a predetermined condition with respect to each other, the constant frequency of the clock signal being higher than the frequency of the phase-shifted signals, and controlling a data rate of the memory module based on the clock signal, wherein the phase-shifted signals are sinusoidal signals.

24. The method according to claim 20, wherein the step of providing comprises a step of generating the n-phase shifted signals as phase-shifted versions of a single input signal.

25. A clock generator for generating a clock signal having a constant frequency for a memory module, comprising:

an interface provided on the memory module for receiving a plurality of n periodical signals having the same frequency and being phase-shifted with respect to each other, wherein n is a natural number ≧3;

a clock signal generator provided on the memory module for generating respective clock edges of the clock signal having a constant frequency when at least two of the phase-shifted signals satisfy a predetermined condition with respect to each other, the constant frequency of the clock signal being higher than the frequency of the phase-shifted signals; and said memory module having a data rate being controlled based on the clock signal.

26. A method for generating a clock signal having a constant frequency for a memory module, comprising:

receiving, at an interface providing on the memory module, a plurality of n periodical signals having the same frequency and being phase-shifted with respect to each other, wherein n is a natural number ≧3;

generating respective clock edges of the clock signal having a constant frequency when at least two of the phase-shifted signals satisfy a predetermined condition with respect to each other, the constant frequency of the clock signal being higher than the frequency of the phase-shifted signals; and controlling a data rate of the memory module based on the clock signal.

* * * * *